United States Patent
Somaschini et al.

(10) Patent No.: US 10,364,145 B2
(45) Date of Patent: Jul. 30, 2019

(54) PROCESS FOR MANUFACTURING A MICROELECTRONIC DEVICE HAVING A BLACK SURFACE, AND MICROELECTRONIC DEVICE

(71) Applicant: STMicroelectronics S.r.l., Agrate Brianza (IT)

(72) Inventors: Roberto Somaschini, Vimercate (IT); Pietro Petruzza, Usmate Velate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 47 days.

(21) Appl. No.: 15/460,767

(22) Filed: Mar. 16, 2017

(65) Prior Publication Data

US 2018/0086633 A1 Mar. 29, 2018

(30) Foreign Application Priority Data

Sep. 26, 2016 (IT) .......................... 102016000096364

(51) Int. Cl.

| G02B 26/08 | (2006.01) |
| B81C 1/00 | (2006.01) |
| G02B 5/00 | (2006.01) |
| G03B 21/28 | (2006.01) |
| G03B 21/00 | (2006.01) |

(Continued)

(52) U.S. Cl.
CPC ...... *B81C 1/00595* (2013.01); *B81C 1/00206* (2013.01); *G02B 5/003* (2013.01); *G02B 26/0833* (2013.01); *G03B 21/28* (2013.01); B81C 2201/0132 (2013.01); B81C 2201/0198 (2013.01); G02B 26/101 (2013.01); G03B 21/008 (2013.01); G03B 21/2033 (2013.01)

(58) Field of Classification Search
CPC ............ B81C 1/00595; B81C 1/00206; B81C 2201/0132; B81C 2201/0198; G02B 5/003; G02B 26/0833; G02B 21/008; G02B 26/101
USPC ....................................... 359/213.1
See application file for complete search history.

(56) References Cited

U.S. PATENT DOCUMENTS

| 8,158,522 B2 * | 4/2012 | Sirajuddin .......... H01L 21/3086 257/E21.218 |
| 2004/0097077 A1 * | 5/2004 | Nallan .............. H01L 21/30655 438/689 |

(Continued)

FOREIGN PATENT DOCUMENTS

| EP | 1420438 A2 | 5/2004 |
| EP | 2902358 A1 | 8/2015 |

OTHER PUBLICATIONS

Murias, D. et al: "Black Silicon Formation Using Dry Etching for Solar Cells Applications," Materials Science and Engineering B 177 (2012), pp. 1509-1513.

(Continued)

*Primary Examiner* — Euncha P Cherry
(74) *Attorney, Agent, or Firm* — Crowe & Dunlevy (57) ABSTRACT

A roughened silicon surface is formed by a process including repetitively performed roughening cycles. Each roughening cycles including a step for depositing a non-planar polymeric layer over an area of a silicon body and a step for plasma etching the polymeric layer and the area of the silicon body etch in a non-unidirectional way. As a result, a surface portion of the silicon body is removed, in a non-uniform way, to a depth not greater than 10 nm.

19 Claims, 6 Drawing Sheets

(51) Int. Cl.
G02B 26/10 (2006.01)
G03B 21/20 (2006.01)

(56) References Cited

U.S. PATENT DOCUMENTS

| | | | |
|---|---|---|---|
| 2008/0023441 A1* | 1/2008 | Tsai | B81C 1/00571 |
| | | | 216/58 |
| 2011/0201205 A1 | 8/2011 | Sirajuddin et al. | |
| 2015/0217990 A1 | 8/2015 | Carminati et al. | |
| 2015/0323782 A1 | 11/2015 | Goren | |

OTHER PUBLICATIONS

IT Search Report and Written Opinion for IT 201600096364 dated Jul. 17, 2017 (7 pages).

\* cited by examiner

PROCESS FOR MANUFACTURING A MICROELECTRONIC DEVICE HAVING A BLACK SURFACE, AND MICROELECTRONIC DEVICE

PRIORITY CLAIM

This application claims the priority benefit of Italian Application for Patent No. 102016000096364, filed on Sep. 26, 2016, the disclosure of which is hereby incorporated by reference in its entirety.

TECHNICAL FIELD

The present invention relates to a process for manufacturing a microelectronic device provided with a black surface, and to a corresponding microelectronic device.

BACKGROUND

As is known, some types of electronic devices, such as Micro-Electro-Mechanical System (MEMS) devices, have black cavities where it is desired to reduce as much as possible entry and/or reflection of light.

This applies, for example, for MEMS micromirrors used in miniaturized projector modules (the so-called picoprojectors), able to project images at a distance or to generate desired patterns of light.

MEMS micromirrors generally include one or more mirror elements suspended over respective cavities and manufactured starting from a body of semiconductor material to be mobile, typically with an inclination or rotation movement, for directing the incident light beam in a desired way.

Figure 1:
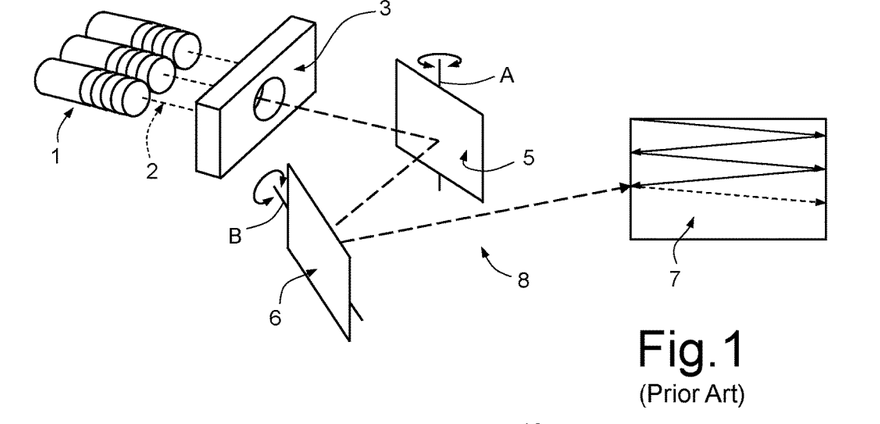
FIG. 1 is a schematic perspective view of a picoprojector.

For example, FIG. 1 is a schematic representation of a picoprojector in which a light source 1, such as a laser source, generates a light beam 2 (generally formed by three monochromatic beams, one for each base color), which, through an optical system 3 represented only schematically, is deflected by a micromirror 8, here formed by a pair of mirror elements 5, 6. The first mirror element 5 may, for example, be a horizontal mirror element, which rotates about a first axis A and generates a fast horizontal scan, and the second mirror element 6 may, for example, be a vertical mirror element, which rotates about a second axis B, transverse, in particular perpendicular, to the first axis A, and generates a slow vertical scan, typically of a sawtooth type. The combination of the movements of the two MEMS mirror elements 5, 6 causes the light beam 2 to perform a complete two-dimensional scanning movement and to generate, once it has been projected onto a projection screen 7, a two-dimensional image thereon. A system of this sort is described, for example, in United States Patent Application Publication No. 2015/0217990 (corresponding to WO 2010/067354), incorporated herein by reference.

A variant of the system of FIG. 1 comprises a single mirror element of a two-dimensional type, which is rotatable both about the horizontal axis B and about the vertical axis A so as to generate the same scanning pattern as FIG. 1.

Another application of MEMS micromirrors are 3D gesture-recognition systems. These normally use a picoprojector and an image-acquisition device, such as a camera. The light beam here may be in the visible range, in the invisible range, or may have any useful frequency. The picoprojector may be similar to the picoprojector of FIG. 1, and the light beam 2 deflected by the micromirror 8 is used for scanning an object in two directions. For example, the picoprojector may project small bands on the object. Any possible projecting or recessed areas of the object (due to the depth thereof) create deformations in the rays of light detected by the camera, which may be processed by a suitable electronics for detecting the third dimension.

In both cases, with the considered technology, the rotation of the mirror element or elements is controlled via an actuation system, which is currently of an electrostatic, magnetic, or piezoelectric type.

Figure 2:
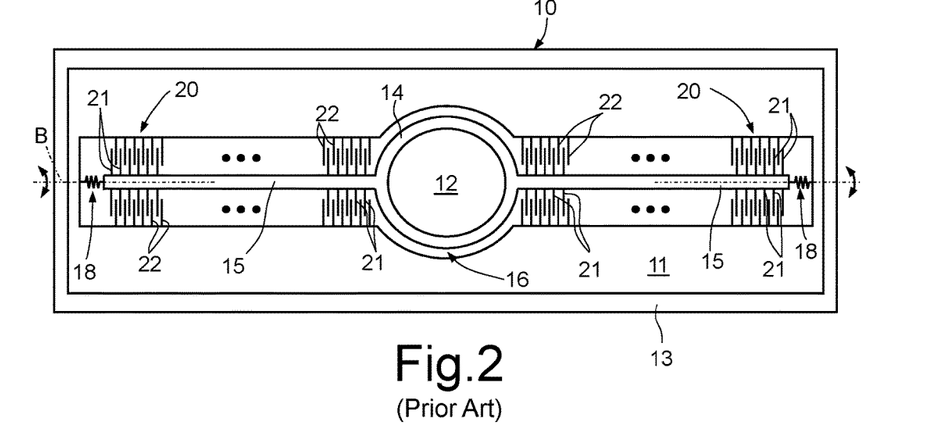
FIG. 2 is a schematic representation of an embodiment of the micromirror of FIG. 1.
Figure 3:
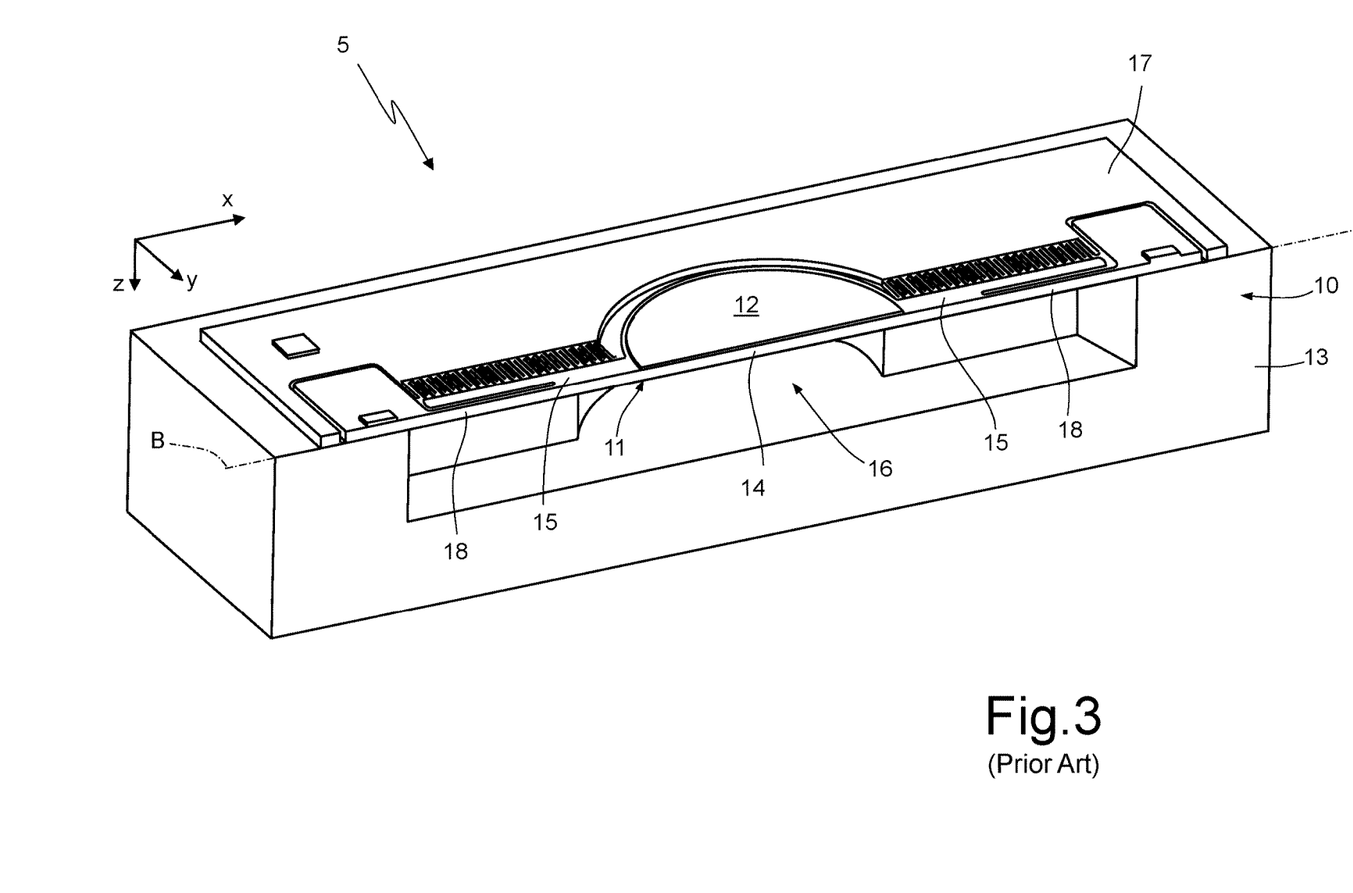
FIG. 3 is a longitudinal section of an embodiment of the micromirror of FIG. 2.

The mirror elements 5, 6 may have the structure shown in FIG. 2 and use a piezoelectric actuation system. Here, a chip 10 of semiconductor material, such as silicon, comprises a structural layer 11 extending over a substrate 13 having a cavity 16 (see, FIG. 3 showing a corresponding cross-sectional view). The structural layer 11 forms an oscillating element 14, arranged over the cavity 16 and carrying a reflecting surface 12. Two supporting arms 15 extend on opposite sides of the oscillating element 14 and define the rotation axis of the oscillating element 14 (for example, rotation axis B of the vertical mirror element 6). The supporting arms 15 are connected via torsion springs 18 to a fixed peripheral portion 17, which is fixed with respect to the substrate 13.

The torsion springs 18 enable rotation of the supporting arms 15 about axis B as a result of actuation assemblies 20, forming a driving structure of an electrostatic type. Each actuation assembly 20 thus comprises mobile electrodes 21 facing fixed electrodes 22.

In detail, the mobile electrodes 21 are fixed with respect to the supporting arms 15 and are combfingered with respect to the fixed electrodes 22 so as to generate a capacitive coupling. The fixed electrodes 22 are carried by the fixed peripheral portion 17 fixed with respect to the substrate 13 of the chip 10. Given the arrangement of the electrodes 21, 22, the driving structure is also defined as a "comb-drive structure".

In a known way, by applying appropriate voltages between the mobile electrodes 21 and the fixed electrodes 22, it is possible to generate attraction/repulsion forces between them so as to cause rotation of the mobile electrodes 21 with respect to the fixed electrodes 22, rotation of the supporting arms 15 about the axis B, and thus the consequent controlled rotation of the oscillating element 14. To this end, as shown in FIG. 3, contact areas 25 are formed on the fixed peripheral area 17 for electrically connecting or biasing the fixed and/or mobile regions.

In the embodiment shown, the oscillating element 14, the supporting arms 15, the torsion springs 18, the mobile and fixed electrodes 21, 22, and the fixed peripheral portion 17 are formed in the structural layer 11, and the substrate 13 closes the cavity 16 at the top.

In the mirror elements 5, 6, whether of a unidirectional type or of a two-dimensional type, spurious reflectivity, i.e., undesired reflection of light by the cavity 16, may occur. In fact, taking into account the typical dimensions of the oscillating element 14 (for example, having a diameter from 1 to 10 mm), the dimensions of the cavity 16 that enables oscillation thereof (for example, having a depth of 100-350 µm), and the tolerances of the optical assembly, part of the light directed towards the mirror elements 5, 6 may penetrate into the cavity 16. This light, delayed or modified in some of its characteristics with respect to the beam correctly reflected by the reflecting surface 12, also referred to as "stray light", may cause an even considerable disturbance of the projection, worsening its performance.

In order to prevent or reduce spurious reflectivity as far as possible, it has already been proposed to treat the inner surface of the cavity 16 to have a roughened surface characteristic so that it behaves as a black cavity when observed under an optical microscope. In particular, it is frequently desirable to have a spurious reflectivity of less than 10%. This treatment may be carried out after etching the substrate 13 to form the cavity 16 so as to increase the surface roughness of the walls thereof.

For example, FIGS. 4-7 show successive steps of a possible process for forming and blackening (i.e., surface roughening) the cavity 16.

Figure 4:
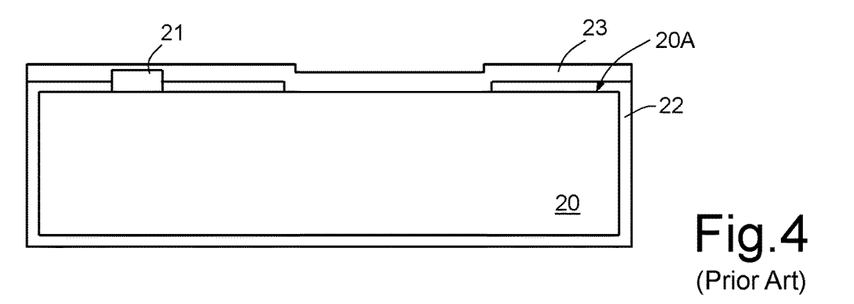
FIGS. 4-7 are cross-sections through a semiconductor material wafer in successive steps of formation of a blacked cavity.

FIG. 4 shows a body 20 of semiconductor material, e.g. silicon, having a top surface 20A and contacts or contact pads 21, of conductive material, on the top surface 20A, for example for grounding the body 20. The body 20 (for example, a wafer designed to form the substrate 13 of FIG. 3 after dicing into single devices, in a manner known to the person skilled in the art) and the contacts or contact pads 21 are coated with an insulating layer 22, for example thermal oxide. The insulating layer 22 is removed from the top surface 20A where a cavity is to be formed. A dielectric material layer 23, for example deposited silicon oxide or nitride, extends over the top surface 20A and over the insulating layer 22, where present, for protecting the contacts or contact pads 21 during etching of the silicon and for preventing formation of cracks therein.

Figure 5:
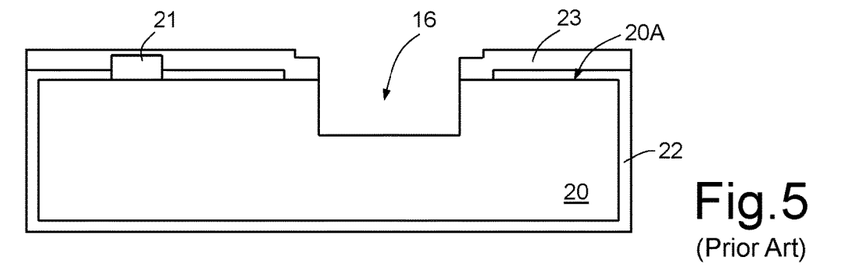
Figure 6:
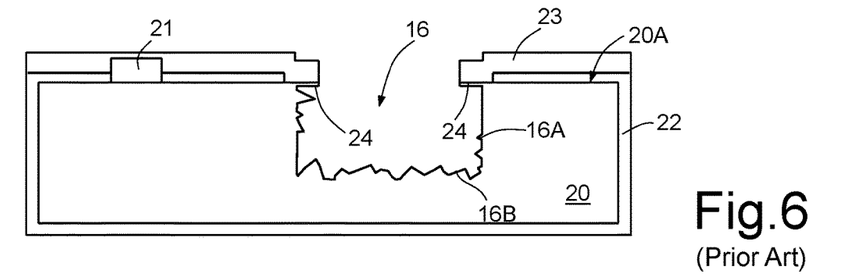
Figure 7:
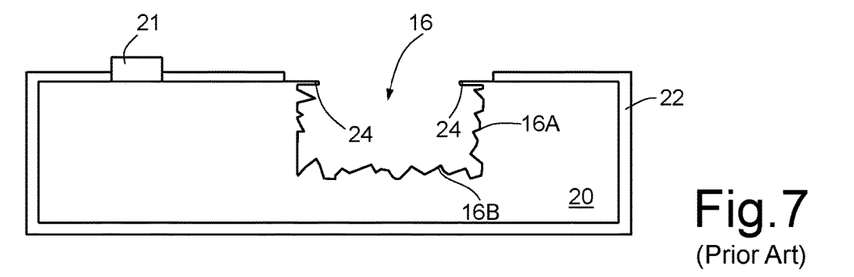

FIG. 5 shows the body 20 after photolithographic masking and etching the dielectric layer 23 and the body 20 for forming the cavity 16. The cavity 16 is typically formed using two separate etches to remove initially the dielectric layer 23 and then the body 20. The two etches are carried out in different apparatuses, generally as dry plasma etches, using different gases. Since the dielectric layer 23 has a protective function for the contacts or contact pads 21, the masking resist (not shown), before the etches, undergoes a curing step.

Then (FIG. 6), the cavity 16 is blackened. For example, to this end, a wet etch may be used, using an acid chemistry that includes $H_2SO_4$ at 80%, $HNO_3$ at 10%, and HF at 10%. In this way, the side walls 16A and the bottom 16B of the cavity 16 have an irregular structure. Etching acts also laterally, forming projecting portions 24 of silicon underneath the edge of the dielectric layer 23. These projecting portions 24, also called "roofs", may have a length of even 20-30 µm and are disadvantageous, in so far as they may have cracks that give rise to defects.

Finally (FIG. 7), the dielectric layer 23 is removed via a blanket dry etch, and the body 20 is cleaned.

Then, the following steps (not shown) are performed of bonding another body and possibly thinning it to form the structural layer 11, defining it to form the oscillating element 14 and the other structures described above, dicing the wafer, etc., in a known manner.

The described process is costly and complex, in so far as it requires numerous steps for depositing the dielectric layer 23; wet etching the walls and bottom of the cavity 16; removing the dielectric layer 23; and final cleaning, in addition to etching the silicon for forming the cavity 16. Further, it is critical because of the possible formation of cracks in the projecting portions 24, which may give rise to portions that may detach and hinder movement of the oscillating element 14.

Also known are other processes of blackening surfaces of silicon regions for different applications; for example, the paper D. Murias et al., "Black Silicon formation using dry etching for solar cells applications", Materials Science and Engineering B 177 (2012) 1509-1513 (incorporated by reference), describes a blackening process for solar cells based upon plasma etching of the silicon surface with $SF_6/O_2$ and $SF_6/O_2/CH_4$ via Reactive Ion Etching (ME). This process entails a micro-oxidation of the surface, with formation of micro-oxidized silicon that functions as micro-masking for etching silicon, and gives rise to pyramidal silicon structures. However, these structures may detach over time, and the process is thus disadvantageous in some applications, such as in micromirrors, where the presence of microparticles may jeopardize proper operation of the device.

There is a need in the art to provide a process for blackening silicon surfaces that overcomes the drawbacks of the prior art.

SUMMARY

A process is provided for the creation of a black silicon surface. A corresponding device is also provided.

In an embodiment, a process for forming a black silicon surface comprises performing a plurality of roughening cycles, wherein each roughening cycle includes: depositing a non-planar polymeric layer over an area of a silicon body; and plasma etching the polymeric layer and the area of the silicon body in a non-unidirectional way and removing, in a non-uniform way, a surface portion of the area of the silicon body.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION

The blackening process described herein is based upon formation of roughness on a silicon surface, by repeating cycles comprising two steps: a first step (referred to as a deposition step, see FIG. 8A) in which a polymeric layer 31 is deposited over a silicon region 30, where the polymeric layer 31 comprises an organic polymer having a non-planar surface structure; and a second step (referred to as an etching step, see FIG. 8B), so that, approximately, the non-planar surface structure of the polymeric layer 31 is reproduced in (i.e., transferred to) the silicon region 30. Typically, in the second step, the polymeric layer (designated by 31' in FIG.

8B) is not completely removed. However, the process functions also in the case of complete removal.

Figure 8A:
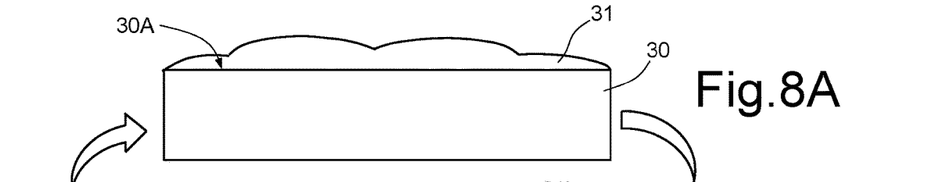
FIGS. 8A and 8B are cross-sections of a silicon body in two successive steps of the present process.
Figure 8B:
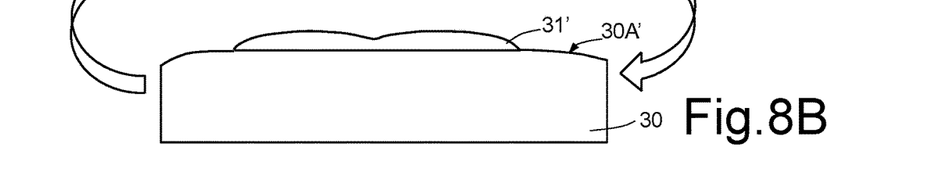

In fact, as may be noted from FIGS. 8A and 8B, during the etching step, by virtue of the non-planar surface structure of the polymeric layer 31, in the points where the layer 31 has a smaller thickness, also a surface part of the silicon region 30 is etched and removed. Thereby, at the end of the second step, the surface 30A of the silicon region 30, which is initially planar (FIG. 8A), becomes rough (surface 30A' of FIG. 8B).

The described steps are carried out, for example, in an Inductive Coupled Plasma (ICP) reactor or in a Transformer Coupled Plasma (TCP) reactor. The polymeric layer 31 is deposited so that the layer 31, which is completely organic, may be easily removed and does not interact with the silicon of the silicon region 30, but deposits thereon. Etching of the polymeric layer 31 and of the surface part of the silicon region 30 is very soft and studied so as to cause a corrugation of the surface of the silicon region 30, without creating deep structures in the silicon (such as pillars or spikes, the so-called "grass"), which could detach during operation of the finished device with the blackened surface.

To obtain this, the time of residence t of the species in the plasma of the process is modulated. In fact, as is known, the time of residence t is proportional to the pressure P in the reactor and to its volume V and inversely proportional to the flow of gas Q, $$t=PV/Q,$$

so that, by changing the time of residence (i.e., acting on the parameters pressure and flow), it is possible to modify the amount of deposited polymer and the rate of the second step in order to obtain selective surface removal of silicon that gives rise to the desired roughness.

In detail, the blackening process of the surface 30A shown in FIGS. 8A-8B is carried out using at least some of the following parameters:

in the deposition step, the polymeric layer 31 is deposited using $C_4F_8$ plasma and, in the second step, etching is carried out using $C_4F_8$ and $SF_6$ plasma;
  in the etching step, also C and/or $O_2$ may be present;
  in the etching step, the ratio between the flow of $SF_6$ and the flow of $C_4F_8$ is 1.5±20%; for example, the flow of $SF_6$ may be 600-700 sccm (standard cubic centimeters per minute) and the flow of $C_4F_8$ may be 400-450 sccm;
  the flow of $C_4F_8$ during the deposition step is typically a little higher than the absolute value of the flow of the same gas during the etching step; for example, with the values indicated above, it is approximately 425 sccm;
  the ratio between the duration of the deposition step and the duration of the etching step is comprised between approximately 0.25 and 0.4, for example, approximately 0.35, except possibly in the first cycle, where, for activating the reactor, the duration of the deposition step may be longer; for example, the deposition step may last 1.4 s (1.5 for the first cycle), and the etching step may last 4 s;
  the ratio of gas pressure in the deposition step to the gas pressure in the etching step is approximately 1.8±5%, except possibly in the first cycle, where, for the same activation reasons, the ratio may be lower; for example, the deposition step may be carried out at a pressure of 90 mtorr (80 mtorr for the first cycle), and the etching step may be carried out at a pressure of 50 mtorr.

With the indicated parameters, performance of the etching step leads to removal of a layer of 10.5 nm of the polymeric layer 31 and of a surface portion of at the most 3 nm of the underlying silicon region 30, where the latter is completely exposed.

The roughness of the surface of the silicon region 30 may be regulated, repeating the two steps a certain number of times or cycles, as described hereinafter with reference to FIGS. 9-13.

Figure 9:
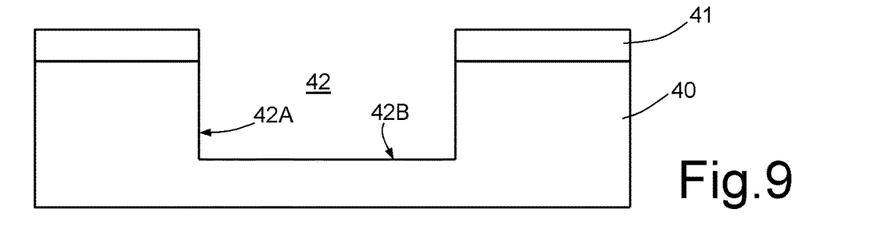
FIGS. 9-12 are cross-sections through a semiconductor material wafer having a cavity repeatedly subjected to the manufacturing steps of FIGS. 8A and 8B, during blackening according to the present process.
Figure 13A:
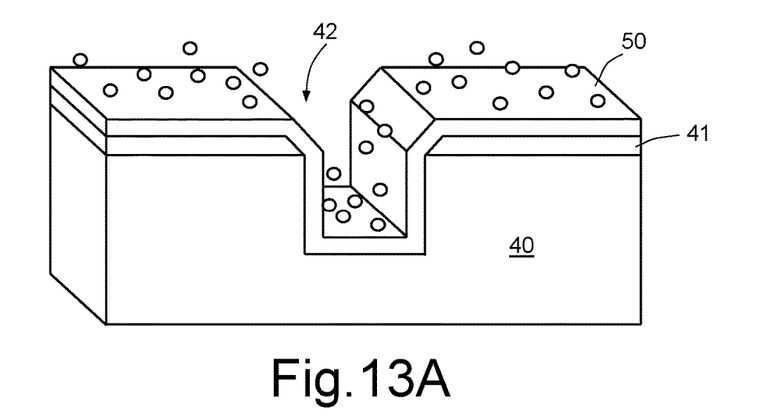
FIGS. 13A-13C are cross-sections through a semiconductor material wafer for forming a cavity, prior to blackening.
Figure 13B:
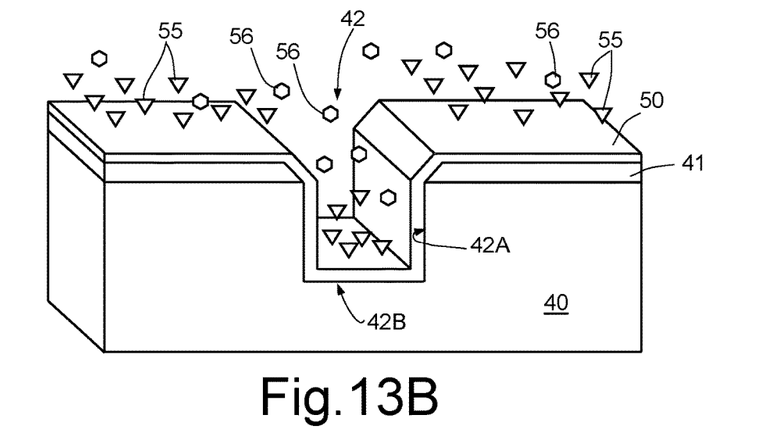
Figure 13C:
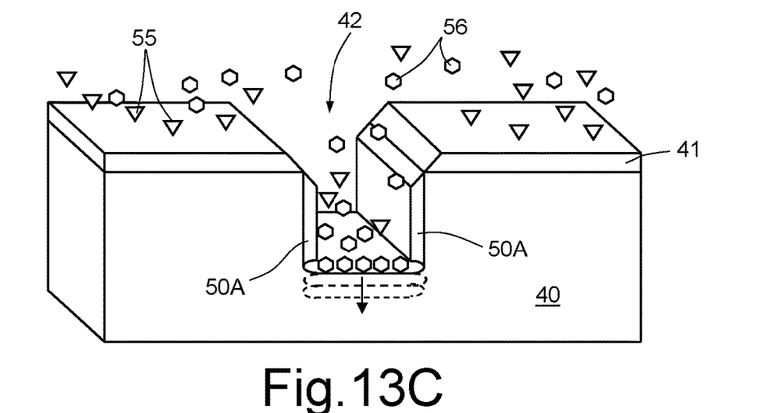

In detail, in FIG. 9, a body 40 of monocrystalline or polycrystalline silicon, covered by a mask 41, for example of photoresist, is initially etched via a deep-etching process, in a per se known manner, for forming a cavity 42 having side walls 42A and bottom walls 42B. This step may be carried out as shown in FIGS. 13A-13C, via repeated cycles of:

conformal deposition of a passivation layer 50 (for example, via deposition in $C_4F_8$ plasma, FIG. 13A);
  removal of the passivation layer 50 from the horizontal surfaces of the structure, via highly directional ion etching in $SF_6/O_2$ plasma (FIG. 13B), where the active ions of the plasma (which are positively charged) are designated by 55, and the free fluorine radicals are designated by 56; by virtue of the directionality of the etch, protective portions 50A remain only on the lateral surfaces 42A of the cavity 42 being formed (FIG. 13C); and
  subsequent etching of the silicon from the bottom of the cavity 42 as a result of the free fluorine radicals 56 for removing a thickness of a few hundred microns (FIG. 13C); the cavity 42 thus increases in depth, as represented in FIG. 13C with a dashed line and arrow.

Repeating the steps of FIGS. 13A-13C, the desired depth of the cavity 42 is obtained. For example, the depth of the cavity 42, at the end of the deep etching step, may be of 100-500 μm.

Figure 10:
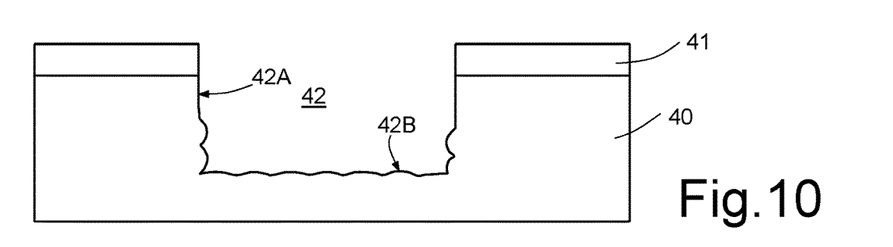

After reaching the desired depth for the cavity 42, and maintaining the same mask 41, the surface of the cavity 42 is roughened or blackened a first time (i.e., a first cycle), using the two-step process described with reference to FIGS. 8A, 8B, with a result as shown in FIG. 10. In this way, the side walls 42A and the bottom 42B have a first roughness. It should be noted that, due to the absence of a polymer protective layer on the side walls 42A and on the bottom 42B of the cavity 42, this process is not directional and operates at a superficial level, removing a thickness of at the most 10 nm, thus without substantially modifying the depth of the cavity 42.

Figure 11:
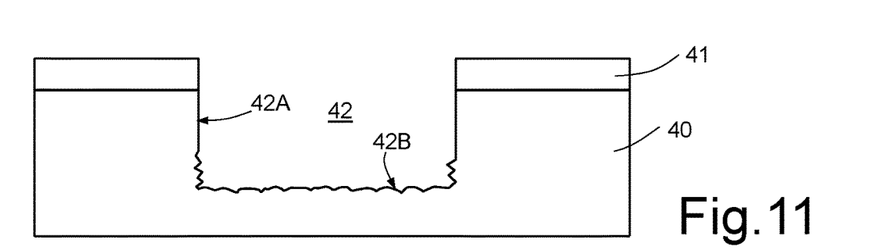

In FIG. 11, the surface of the cavity 42 is blackened, i.e., becomes rougher, by exploiting a second roughening cycle with the two-step process described with reference to FIGS. 8A and 8B. Since, at the start of this second cycle, the surface of the cavity 42 has the first roughness, at the end of the second cycle, the roughness of the side walls 42A and of the bottom 42B is increased, and these have a second roughness, greater than the first roughness.

Figure 12:
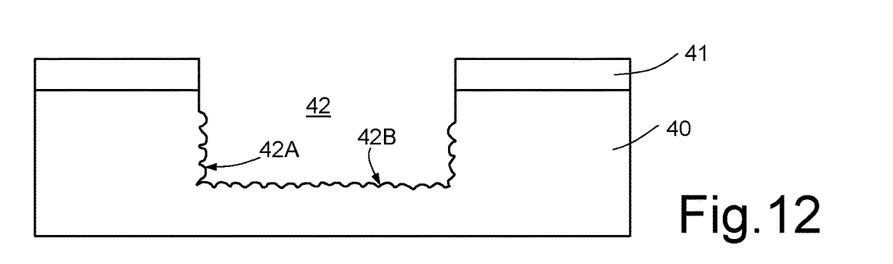

In FIG. 12, the surface of the cavity 42 is roughened and blackened a third time, performing a further roughening cycle with the two-step process described with reference to FIGS. 8A and 8B. Consequently, the roughness of the side walls 42A and of the bottom 42B increases, and they have a third roughness, greater than the second roughness.

The cycles described with reference to FIGS. 10-12 may be repeated several times, even 20-30 or more, until a desired level of roughness is reached, compatibly with an industrial process.

The process described has numerous advantages.

In particular, it is simple and inexpensive, since it does not require additional masks or additional layers on thin layers.

It integrates the structure definition steps, in particular for forming a cavity, with the blackening step, since they may be carried out in a same reactor, and does not cause formation of structures and particles that could cause disturbance for operation of the finished device. The process is further completely compatible with the current processes of micromachining semiconductor materials.

Finally, the described process is particularly suitable for blackening the cavity underlying the oscillating element of a mirror element 5, 6 of the type shown in FIGS. 2-3, since the obtainable blackening may achieve very low indices of spurious reflectivity, depending upon the roughness obtained, for example indices lower than 2%.

The obtained rough surfaces have a morphology characterized by low projections at a high density and rather blunt. For example, the obtained projections may have a diameter comprised between 0.5 and 2 µm and a height of approximately 0.5 µm, according to the roughness to be obtained, without bonds, in particular Si—O bonds, since the polymers deposited during the first step of FIG. 8A (similar to Teflon) are simply deposited on the silicon and do not bind thereto. In this way, in samples obtained by the applicant, it has been possible to achieve a reflectivity in the region of 1%.

The mirror element 5, 6 having the cavity 42 may be part of a micromirror such as the micromirror 8 of FIG. 1 and be used in a picoprojector 201 designed to be functionally coupled to a portable electronic apparatus 200, as illustrated hereinafter with reference to FIGS. 14-16.

Figure 14:
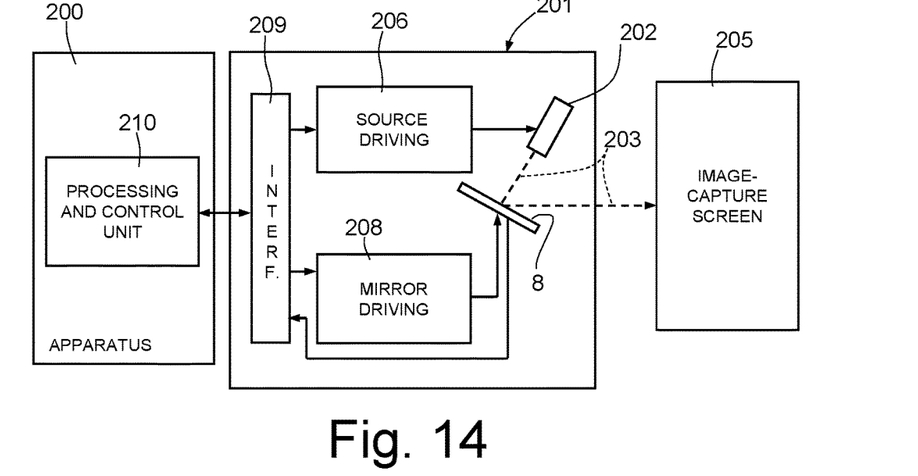
FIG. 14 is a block diagram of a picoprojector using the present micromirror device.

In detail, the picoprojector 201 of FIG. 14 comprises a light source 202, for example of a laser type, intended to generate a light beam 203; the micromirror device 8, intended to receive the light beam 203 and to orient it towards a screen or an image-capture module 205 (external and arranged at a distance from the picoprojector 201); a first driving circuit 206, intended to supply appropriate control signals to the light source 202, for generating the light beam 203 according to an image to be projected; a second driving circuit 208, intended to supply driving signals to rotate the oscillating element 14 (FIGS. 2 and 3) of the micromirror element 5, 6; and a communication interface 209, intended to receive, from a control unit 210, internal or external, for example included in the portable apparatus 200, brightness information on the image to be generated, for example in the form of an array of pixels. The brightness information is sent to an input to drive the light source 202.

Further, the control unit 210 may comprise a unit for controlling the angular position of the mirror of the micromirror device 130. To this end, the control unit 210 may receive the signals generated by photodetectors (not represented in FIG. 14) through the interface 209 and control the second driving circuit 208 accordingly.

Figure 15:
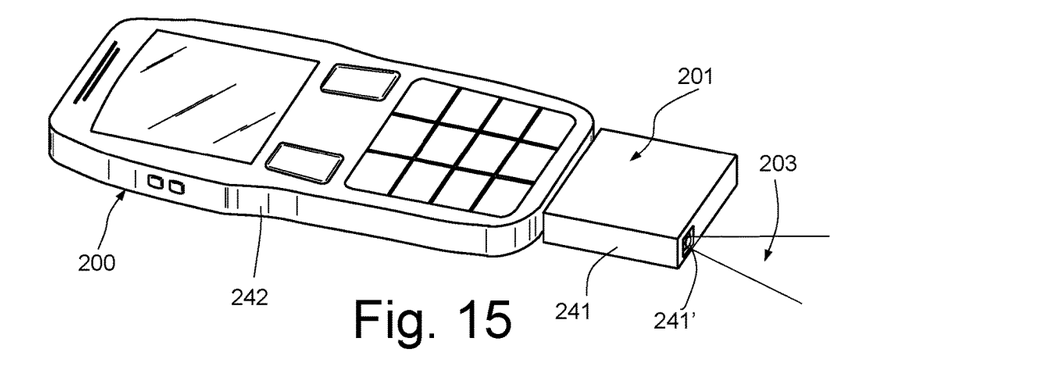
FIGS. 15 and 16 show different solutions for coupling the picoprojector of FIG. 14 and a portable electronic apparatus.

The picoprojector 201 may be formed as a separate and stand-alone accessory with respect to an associated portable electronic apparatus 200, for example a cellphone or smartphone, as shown in FIG. 15. In this case, the picoprojector 201 is coupled to the portable electronic apparatus 200 by appropriate electrical and mechanical connection elements (not illustrated in detail). Here, the picoprojector 201 is provided with an own casing 241, which has at least one portion 241' transparent to the light beam 203 coming from the micromirror device 130. The casing 241 of the picoprojector 201 is releasably coupled to a respective casing 242 of the portable electronic apparatus 200.

Figure 16:
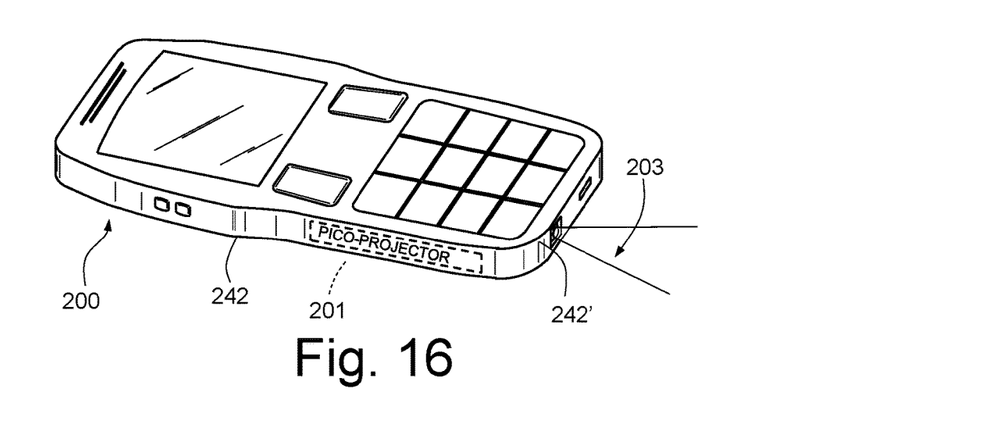

Alternatively, as illustrated in FIG. 16, the picoprojector 201 may be integrated within the portable electronic apparatus 200 and be arranged within the casing 242 of the portable electronic apparatus 200. In this case, the portable electronic apparatus 200 has a respective portion 242' transparent to the light beam 203 coming from the micromirror 8. The picoprojector 201 in this case is, for example, coupled to a printed-circuit board in the casing 242 of the portable electronic apparatus 200.

Finally, it is clear that modifications and variations may be made to the process and to the device described and illustrated herein, without thereby departing from the scope of the present invention, as defined in the attached claims.

For example, the process described herein applies to any silicon surface that is to be rendered rough, even in the absence of cavities or trenches.

The invention claimed is:

1. A process, comprising:
    etching a trench into a silicon body, said trench including a sidewall surface and a bottom surface; and
    roughening the sidewall surface and bottom surface of the trench to reduce surface reflectivity by performing a plurality of roughening cycles, wherein each roughening cycle includes:
        depositing a polymeric layer having a non-planar surface profile over the sidewall surface and bottom surface of the trench; and
        plasma etching the polymeric layer and the area of the silicon body at the sidewall surface and bottom surface of the trench in a non-unidirectional way to remove, in a non-uniform way, at least a portion of the polymeric layer and a surface portion of the area of the silicon body so as to replicate said non-planar surface profile of the polymeric layer on the sidewall surface and bottom surface of the trench.

2. The process according to claim 1, wherein plasma etching comprises removing said surface portion to a depth that is not greater than 10 nm at the sidewall surface and bottom surface of the trench.

3. The process according to claim 1, wherein depositing is carried out with a $C_4F_8$ plasma and plasma etching is carried out with a $C_4F_8$ and $SF_6$ plasma.

4. The process according claim 1, wherein plasma etching comprises supplying a first flow of $SF_6$ and supplying a second flow of $C_4F_8$, wherein a ratio between the first flow and the second flow is approximately 1.5±20%.

5. The process according to claim 4, wherein plasma etching comprises also supplying at least one of C and $O_2$.

6. The process according to claim 4, wherein depositing comprises supplying a third flow of $C_4F_8$, the third flow being greater than the second flow.

7. The process according to claim 6, wherein a ratio between the third flow and the second flow is less than 1.5.

8. The process according to claim 6, wherein the first flow is at a rate of 650 sccm, the second flow is at a rate of 400 sccm, and the third flow is at a rate of 425 sccm.

9. The process according to claim 1, wherein depositing is carried out for a deposition time and plasma etching is carried out for an etching time, and wherein a ratio between the deposition time and the etching time during at least one roughening cycle is between approximately 0.25 and 0.4.

10. The process according to claim 9, wherein said ratio is approximately 0.35.

11. The process according to claim 1, wherein depositing is carried out for a deposition time and plasma etching is carried out for an etching time, and wherein a ratio between the deposition time and the etching time during a first roughening cycle is different from a ratio between the deposition time and the etching time during roughening cycles subsequent to said first roughening cycle.

12. The process according to claim 11, wherein the etching time is substantially the same in all roughening cycles and wherein the deposition time is longer in the first roughening cycle than in roughening cycles subsequent to said first roughening cycle.

13. The process according to claim 12, wherein the deposition time in the first roughening cycle is approximately 1.5 s and the deposition time in roughening cycles subsequent to said first roughening cycle is approximately 1.4 s.

14. The process according to claim 13, wherein the etching time is approximately 4 s in all roughening cycles.

15. The process according to claim 1, wherein depositing is carried out at a first plasma pressure, and plasma etching is carried out at a second plasma pressure, and wherein a ratio between the first and second pressures is approximately 1.8±5% in at least one roughening cycle.

16. The process according to claim 15, wherein said ratio is the same in all roughening cycles except for a first roughening cycle.

17. The process according to claim 16, wherein the first plasma pressure is approximately 80 mtorr in the first roughening cycle and the first plasma pressure is approximately 90 mtorr in roughening cycles subsequent to said first roughening cycle, and wherein the second plasma pressure is approximately 50 mtorr.

18. The process according to claim 1, wherein the roughened sidewall surface and bottom surface of the trench, after performing said plurality of roughening cycles, has a reflectivity of less than 10%.

19. The process according to claim 1, wherein said roughened sidewall surface and bottom surface of the trench is characterized by projections having a height-to-width ratio comprised between 1:1 and 1:5 and a high density.

* * * * *

UNITED STATES PATENT AND TRADEMARK OFFICE
CERTIFICATE OF CORRECTION

PATENT NO. : 10,364,145 B2
APPLICATION NO. : 15/460767
DATED : July 30, 2019
INVENTOR(S) : Roberto Somaschini et al.

Page 1 of 1

It is certified that error appears in the above-identified patent and that said Letters Patent is hereby corrected as shown below:

In the Specification

Column 4, Line 1, please replace the term [[ (ME) ]] with -- (RIE) --.

Signed and Sealed this
Fifth Day of May, 2020

Andrei Iancu
*Director of the United States Patent and Trademark Office*